US012735801B2

(12) United States Patent
Vilatela García et al.

(10) Patent No.: US 12,735,801 B2
(45) Date of Patent: Sep. 15, 2026

(54) NANOWIRES NETWORK

(71) Applicant: FUNDACIÓN IMDEA MATERIALES, Madrid (ES)

(72) Inventors: Juan José Vilatela García, Madrid (ES); Richard Santiago Schäufele, Madrid (ES); Isabel Gómez Palos, Madrid (ES); Miguel Vázquez Pufleau, Madrid (ES)

(73) Assignee: FUNDACIÓN IMDEA MATERIALES, Madrid (ES)

( * ) Notice: Subject to any disclaimer, the term of this patent is extended or adjusted under 35 U.S.C. 154(b) by 359 days.

(21) Appl. No.: 18/559,117

(22) PCT Filed: May 5, 2022

(86) PCT No.: PCT/EP2022/062149
§ 371 (c)(1),
(2) Date: Nov. 6, 2023

(87) PCT Pub. No.: WO2022/234014
PCT Pub. Date: Nov. 10, 2022

(65) Prior Publication Data

US 2024/0229290 A1 Jul. 11, 2024

(30) Foreign Application Priority Data

May 6, 2021 (EP) .................................... 21382408

(51) Int. Cl.

| | |
|---|---|
| ***C30B 11/12*** | (2006.01) |
| ***C30B 29/36*** | (2006.01) |
| ***C30B 29/66*** | (2006.01) |

(52) U.S. Cl.
CPC .............. *C30B 11/12* (2013.01); *C30B 29/36* (2013.01); *C30B 29/66* (2013.01)

(58) Field of Classification Search
CPC .......... C30B 11/12; C30B 29/36; C30B 29/66
See application file for complete search history.

(56) References Cited

U.S. PATENT DOCUMENTS

| | | | |
|---|---|---|---|
| 8,183,566 | B2 * | 5/2012 | Kobayashi ........ H01L 21/02645 257/53 |
| 9,574,286 | B2 | 2/2017 | Alcott et al. |
| 2002/0094318 | A1 | 7/2002 | Lee et al. |
| 2005/0266662 | A1 | 12/2005 | Yi |
| 2010/0012921 | A1 | 1/2010 | Kawashima et al. |
| 2010/0065810 | A1 | 3/2010 | Goesele et al. |
| 2010/0212787 | A1 * | 8/2010 | Gash ....................... C06B 33/00 149/75 |
| 2011/0113484 | A1 | 5/2011 | Zeuthen |
| 2013/0017145 | A1 | 1/2013 | Sunkara et al. |

(Continued)

OTHER PUBLICATIONS

Schaufele et al., "Tough sheets of nanowires produced floating in the gas phase," Materials Horizons, 2020, vol. 7, pp. 2978-2984.

(Continued)

*Primary Examiner* — Robert M Kunemund
(74) *Attorney, Agent, or Firm* — McKee, Voorhees & Sease, PLC

(57) ABSTRACT

The present invention refers to a method for preparing a network of nanowires; to a network of nanowires obtainable by said method; to a nonwoven material comprising the network, to an electrode comprising the network, to the use of the network of nanowires and to the use of the nonwoven material.

16 Claims, 6 Drawing Sheets

(56) References Cited

U.S. PATENT DOCUMENTS

| | | | | |
|---|---|---|---|---|
| 2013/0022995 | A1 | 1/2013 | Park et al. | |
| 2013/0098288 | A1 | 4/2013 | Samuelson et al. | |
| 2014/0345686 | A1* | 11/2014 | Heurlin | H10D 62/119 136/256 |
| 2016/0043385 | A1* | 2/2016 | Ryan | C23C 16/52 429/231.95 |
| 2016/0130698 | A1 | 5/2016 | Alcott | |
| 2020/0203969 | A1 | 6/2020 | Truettner et al. | |
| 2022/0389614 | A1 | 12/2022 | Vilatela Garcia et al. | |

OTHER PUBLICATIONS

Zhang et al. "Centimeter-long single-crystalline Si nanowires." Nano Letters 17.12 (2017): 7323-7329.

Zhang et al. "Supporting information for Centimeter-long single-crystalline Si nanowires." Nano Letters 17.12 (2017): 1-13.

An et al. "Flexible and recoverable SiC nanofiber aerogels for electromagnetic wave absorption." Ceramics International 45.17 (2019): 22793-22801.

Catenacci et al. "Stretchable conductive composites from Cu—Ag nanowire felt." ACS nano 12.4 (2018): 3689-3698.

Heurlin et al. "Continuous gas-phase synthesis of nanowires with tunable properties." Nature 492.7427 (2012): 90-94.

Koziol et al. "Synthesis of carbon nanostructures by CVD method." Carbon and Oxide Nanostructures: Synthesis, Characterisation and Applications. Berlin, Heidelberg: Springer Berlin Heidelberg (2010): 23-49.

Magnusson et al. "Semiconductor nanostructures enabled by aerosol technology." Frontiers of Physics 9.3 (2014): 398-418.

Smail et al. "Direct spinning of CNT fibres: Past, present and future scale up." Carbon 152 (2019): 218-232.

* cited by examiner

NANOWIRES NETWORK

CROSS REFERENCE TO RELATED APPLICATIONS

This is a U.S. National Phase application claiming priority to PCT/EP2022/062149, filed May 5, 2022, which application claims priority to European application 21382408.9, filed May 6, 2021, the entire contents of which are hereby expressly incorporated by reference in their entirety including, without limitation, the specification, claims, and abstract, as well as any figures, tables, or drawings thereof.

FIELD OF THE INVENTION

The present invention relates to the synthesis of a network of nanowires. More specifically, the present invention relates to a process for the fabrication of a nanowires network for use in fields such as wearable electronics, sensors and flexible batteries.

BACKGROUND

Networks comprised of nanowires present advantages over materials made of larger building blocks. In general, nanowires are mechanically flexible due to their nanoscale dimensions and have a reduced amount of defects in comparison with bulk materials. They also display various optoelectronic properties resulting from their small size and one-dimensional morphology. Consequently, some of the properties of the nanowires networks depend on the characteristics of the nanowires. Thus a high degree of control over the nanowires' crystalline quality, morphology and size distribution is needed.

WO2011156019 (A2) describes the synthesis of group IV metal or semiconductor nanowires and a process of introducing the as-produced nanowires into macroscopic "fabrics". These are self-standing nanowires networks that can be used for a variety of micro electronic devices which require large amounts of material such as Li-ion-battery electrodes. The nanowires are produced under supercritical fluid conditions in an autoclave reactor, referred to as supercritical fluid-liquid-solid (SFLS) growth An approach for fabricating "percolating networks" of nanowires has been reported and it involves the use of a spray nozzle for dispersing aerotaxy-grown nanowires on a substrate (U.S. Pat. No. 9,574,286B). Of note, the process to produce percolating networks is carried out only after the synthesis, as a subsequent and independent fabrication step. Furthermore, it is not clear from U.S. Pat. No. 9,574,286B that such method might lead to a nanowire ensemble that is self-standing, a pre-requisite to consider it an integrated material by itself.

Schäufele et al. (Mater. Horiz., 2020, 7, 2978-2984) describes a route for the continuous production of silicon nanowires suspended in gas phase, as well as their assembly into macroscopic sheets. The method is performed by floating catalyst chemical vapor deposition using an aerosol of gold particles. However, although the nanowires have high aspect ratio and the resulting sheets combine good mechanical properties, the method produces not only nanowires but also (quasi)spherical particles that can be detrimental for the bulk properties of nanowire assemblies. Thus, the production of these nanoparticles, instead of high-aspect ratio nanowires, is often undesired and should be avoided as much as possible.

In summary, there is a need to develop one-step methods for synthesis of networks of nanowires with good mechanical properties that also overcome prior art limitations.

BRIEF DESCRIPTION OF THE INVENTION

The inventors of the present invention have found a one-step method for producing self-standing networks of nanowires with good mechanical properties, such as good flexibility in bending, and wherein the nanowires have larger lengths which renders said nanowires with higher aspect ratios. The discovery of self-standing networks of nanowires that are also flexible represents a breakthrough since they allow post-production manipulation of the nanowire network as an engineering material, rather than as a powder or filler which typically undergo degradation and/or nanowire shortening during dispersion upon processing. In addition, the inventors have observed that the method of the present invention allows the production of networks of nanowires in large amounts and at high rates, and advantageously said method increases the fraction of nanowires in the network of nanowires thus reducing significantly the presence of other structures, such as quasi-spherical particles.

This approach is of great importance for a large variety of applications of networks of nanowires in various technological fields, since it solves the current limitations of the prior art. In addition, the method of the present invention is based on aerosol technology and has the potential of being scaled up to produce large amounts of product, while maintaining a high level of control over the process.

Thus, in a first aspect, the invention is directed to a method for preparing a network of nanowires comprising the steps of:

i. providing a gas flow mixture to a reaction vessel, said gas flow mixture comprising:
   - at least one precursor compound comprising at least one element selected from Si, Ge, Cu, Zn, Cd, Ga, In, As, Ni, Se, Ta, Pt, Mo, W, N, O, Co, Mn, Li and Te; wherein the at least one precursor compound is an hydride or organometallic compound, and
   - metallic catalyst particles comprising one or more elements selected from Au, Ag, Cu, Fe, Ni, Ga, Co, Pt, In and Al;

wherein the at least one precursor compound is in the gas flow mixture in a mole fraction (xi) of at least 0.005;

wherein the temperature inside the reaction vessel ranges from 1100 to 1600° C.; and wherein the at least one precursor compound decomposes under the temperature inside the reaction vessel and grows on the metallic catalyst particles, preferably by vapor liquid-solid (VLS) and/or solid-liquid-solid (SLS) and/or chemical vapor deposition (CVD);

to form a network of nanowires;

wherein the network of nanowires comprises solid nanowires, hollow nanowires or mixtures thereof.

In a second aspect, the invention is directed to a network of nanowires obtainable by the method as defined above; wherein the aspect ratio (length/diameter) of the nanowires of the network of nanowires is at least 300; wherein the network of nanowires of the present invention comprises at least a 20% volume of nanowires of the total volume of the network.

In a third aspect, the present invention is directed to a nonwoven material comprising at least two layers of the network of nanowires of the present invention.

Another aspect of the invention is directed to an electrode comprising the network of nanowires of the present invention in any of its particular embodiments or the nonwoven material of the present invention in any of its particular embodiments; and an electrical connection or a current collector.

In a further aspect, the present invention is directed to the use of the network of nanowires of the present invention or the nonwoven material of the invention, in batteries, preferably in lithium-ion batteries.

In a further aspect, the present invention is directed to the use of the network of nanowires of the present invention or the nonwoven material of the invention, in electronic devices, preferably in optoelectronic devices.

In a further aspect, the present invention is directed to the use of the network of nanowires of the present invention or the nonwoven material of the invention, in heat transfer materials, biocompatible materials; or in radiation absorbing materials.

FIGURES

DETAILED DESCRIPTION OF THE INVENTION

Figure 1:
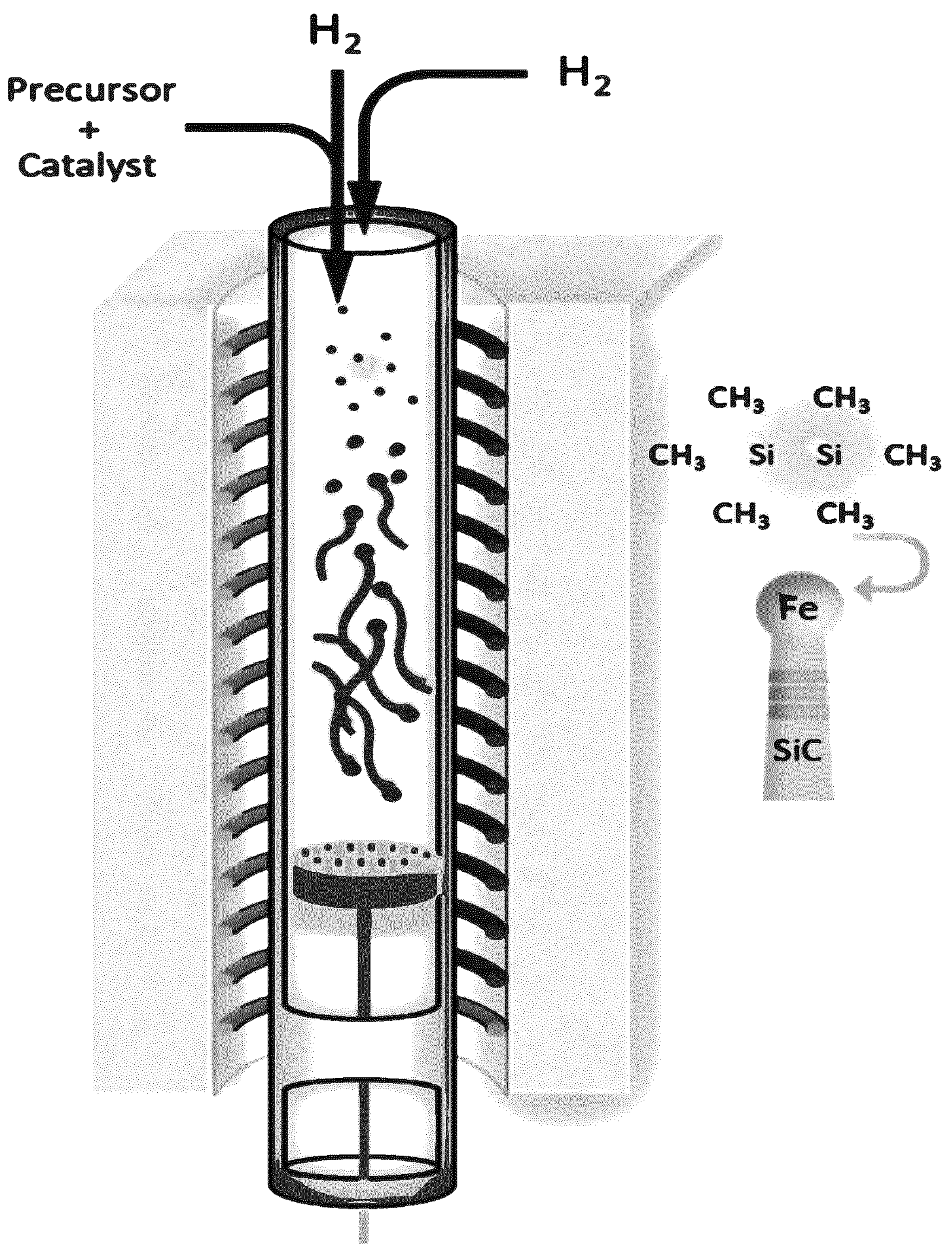
FIG. 1 shows a setup to produce SiC nanowires.

Unless defined otherwise, all technical and scientific terms used herein have the same meaning as commonly understood to one of ordinary skill in the art to which this disclosure belongs. As used herein, the singular forms "a" "an" and "the" include plural reference unless the context clearly dictates otherwise.

The present invention is directed to a method for preparing a network of nanowires, to the network of nanowires obtainable by said method, to a nonwoven material comprising the network of nanowires, to an electrode comprising the network of nanowires or the nonwoven material of the invention and to the uses of the network of nanowires of the invention and the nonwoven material.

The nanowires of the network of nanowires of the present invention are high aspect ratio structures that may be made of a solid material or may be hollow (having a tube shape). In an embodiment, the nanowires are continuous structures (not porous); preferably solid continuous structures. In another embodiment, the nanowires form a net by joining among each other during their synthesis.

Method

In a first aspect, the invention is directed to a method for preparing a network of nanowires comprising the steps of:

i. providing a gas flow mixture to a reaction vessel, said gas flow mixture comprising;
    at least one precursor compound comprising at least one element selected from Si, Ge, Cu, Zn, Cd, Ga, In, As, Se, Ta, Pt, Mo, W, N, Ni, O, Co, Mn, Li and Te; and wherein the at least one precursor compound is an hydride or organometallic compound; and
    metallic catalyst particles comprising one or more elements selected from Au, Ag, Cu, Fe, Ni, Ga, Co, Pt, In and Al;
  wherein the at least one precursor compound is in the gas flow mixture in a mole fraction (xi) of at least 0.005;
  wherein the temperature inside the reaction vessel ranges from 1100 to 1600° C.; and
  wherein the at least one precursor compound decomposes under the temperature inside the reaction vessel and grows on the metallic catalyst particles, preferably by vapor liquid-solid (VLS) and/or solid-liquid-solid (SLS) and/or chemical vapor deposition (CVD) methods; to form a network of nanowires; and
  wherein the network of nanowires comprises solid nanowires, hollow nanowires or mixtures thereof.

The method for preparing a network of nanowires may comprise a further step of transforming the network of nanowires into fibers, yarns or fabrics. In an embodiment, the step of transforming the network of nanowires into fibers, yarns or fabrics is optionally performed at the same time as step (i) of the method of the invention.

In a particular embodiment, the method for preparing a network of nanowires comprises a further step (ii) of collecting the network of nanowires; particularly by spinning and winding the network of nanowires (optionally as a yarn or a fabric) on a bobbin.

In an embodiment, the method of the present invention is a continuous method.

The method for preparing a network of nanowires of the present invention comprises a step (i) of providing a gas flow mixture to a reaction vessel comprising at least one precursor compound comprising at least one element selected from Si, Ge, Cu, Zn, Cd, Ga, In, As, Se, Ta, Pt, Mo, W, N, Ni, O, Co, Mn, Li and Te; and wherein the at least one precursor compound is an hydride or organometallic compound.

In a particular embodiment, the gas flow mixture further comprises $H_2$. In a particular embodiment, the gas flow mixture comprises an inert gas, particularly $N_2$.

Precursor

The step (i) of the method of the present invention provides a gas flow mixture to a reaction vessel wherein said gas flow mixture comprises at least one precursor compound. In a particular embodiment, the at least one precursor compound is a compound that participates in a reaction (i.e. chemical reaction) that produces the nanowire network of the present invention. For example, hexamethyldisilane (HMDS) is a precursor compound that when used in the method of the present invention may lead to a SiC nanowire network.

In a particular embodiment, the at least one precursor compound of the method of the present invention comprises at least one element selected from Si, Ge, Cu, Zn, Cd, Ga, In, As, Se, Ta, Pt, Cu, Mo, W and Te; preferably Si, Ge, Cu, Zn, Ga, In, Se, Ta, Pt, Mo, W, and Te; particularly Si, Ge, In, Ga, Se and Te; more particularly Si, Ge, In and Ga; even more particularly Si, Ge and In; even much more particularly Si and Ge; even more particularly Si.

In a particular embodiment, the at least one element of the precursor compound is different from the one or more element of the metallic catalysts particles.

In a particular embodiment, the at least one precursor compound is a mixture of precursors.

In a particular embodiment, the at least one precursor compound is one precursor compound.

The at least one precursor compound may be in solid, liquid form (i.e. aerosolized in the first gas flow of the method of the present invention) or in gas form. In a particular embodiment, the at least one precursor compound is in liquid or gas form; preferably in liquid form.

In a particular embodiment, the at least one precursor compound of the method of the present invention is a metallic hydride or an organometallic compound. In a preferred embodiment, the at least one precursor compound of the method of the present invention is a metallic hydride.

In another preferred embodiment, the at least one precursor compound of the method of the present invention is an organometallic compound.

In the context of the present invention, organometallic compounds are chemical compounds as known in the art which comprise at least one bond between a metallic or metalloid element (such as boron, silicon, germanium, arsenic, tellurium or selenium) and a carbon atom belonging to an organic molecule or functional group.

Precursors of the present invention include but are not limited to compounds such as (3-Aminopropyl)triethoxysilane, N-sec-Butyl(trimethylsilyl)amine, chloropentamethyldisilane, hexamethyldisilane, tetramethylsilane, silicon tetrabromide, silicon tetrachloride, tris(tert-butoxy)silanol, $SiH_4$, tetramethylgermanium, triethylgermanium hydride, triphenylgermanium hydride, triphenylgermanium hydride, tetramethylgermanium, tributylgermanium hydride, triethylgermanium hydride, triphenylgermanium hydride, trimethylindium (TMin), trimethylindium (TEIN), trimethylgallium (TMG), triethylgallium (TEG), dimethyl selenide, tellurium tetrachloride, trimethylaluminium (TMAl), triethylaluminium (TEAl), $NH_3$, $AsH_3$ and $PH_3$; particularly (3-Aminopropyl)triethoxysilane, N-sec-Butyl(trimethylsilyl)amine, chloropentamethyldisilane, hexamethyldisilane, tetramethylsilane, silicon tetrabromide, silicon tetrachloride, tris(tert-butoxy)silanol, $SiH_4$, tetramethylgermanium, triethylgermanium hydride, triphenylgermanium hydride, triphenylgermanium hydride, tetramethylgermanium, tributylgermanium hydride, triethylgermanium hydride, triphenylgermanium hydride, trimethylindium (TMin), trimethylindium (TEIN), trimethylgallium (TMG), triethylgallium (TEG), dimethyl selenide and tellurium tetrachloride;

more particularly (3-Aminopropyl)triethoxysilane, N-sec-Butyl(trimethylsilyl)amine, chloropentamethyldisilane, hexamethyldisilane, tetramethylsilane, silicon tetrabromide, silicon tetrachloride, tris(tert-butoxy)silanol, $SiH_4$, tetramethylgermanium, triethylgermanium hydride, triphenylgermanium hydride, triphenylgermanium hydride, tetramethylgermanium, tributylgermanium hydride, triethylgermanium hydride and triphenylgermanium hydride; even more particularly $SiH_4$ or hexamethyldisilane.

In an embodiment, the at least one precursor is a silane or a silane derivate; preferably is a silane derivative; more preferably is 3-aminopropyltriethoxysilane, N-sec-Butyl (trimethylsilyl)amine, chloropentamethyldisilane, hexamethyldisilane, tetramethylsilane or a mixture thereof; more preferably is hexamethyldisilane.

In a particular embodiment, the gas flow mixture comprises more than one precursor compound. In particular, the gas flow mixture comprises a first precursor compound and additional precursor compounds. In a particular embodiment, the additional precursor compounds may be used as dopants of the nanowire network (in less amount than that of the main precursor compound). Suitable dopants depend on the nanowire material being doped.

In a particular embodiment, the at least one precursor compound of the present invention is provided to the reaction vessel of the present invention at a rate of at least 0.0010 mol/h; preferably at a rate of at least 0.0015 mol/h; more preferably of at least 0.0020 mol/h; even much more preferably of about 0.0025 mol/h.

In a particular embodiment, the method comprises adding or injecting an additional gas flow comprising an inert gas, preferably $N_2$.

In a more particular embodiment, the additional gas flow of the method of the present invention further comprises $H_2$.

In a particular embodiment only one type of gas or of gas mixture is used in the invention; preferably $N_2$ and/or $H_2$.

Catalyst

The gas flow mixture provided in the method for preparing a network of nanowires of the present invention comprises metallic catalyst particles.

In a particular embodiment, the metallic catalyst particles used in the method of the present invention comprise one or more elements selected from Au, Ag, Cu, Fe, Ni, Ga, Co, Pt, In and Al; particularly comprise one or more elements selected from Au, Ag, Cu, Fe, Co and Pt; preferably Fe. The metallic catalytic particles may consist of a single element, or a combination (e.g. alloy) of two or more elements. The metallic catalyst particles may be in the gas flow as solid particles or as liquid particles; preferably as solid particles. In another particular embodiment, the catalyst particles may be generated by decomposition of a metallic precursor in the gas flow mixture; particularly an organometallic compound; more particularly ferrocene.

In another particular embodiment, the metallic catalyst particles used in the method of the present invention further comprise one or more additional elements selected from group 16 elements to control and/or to enhance the growth of nanowires. This additional elements are particularly selected from oxygen, sulfur, selenium, tellurium, and polonium; more particularly selected from S, Se, Te and O.

In a particular embodiment, the metallic catalyst particles consist of one element selected from Au, Ag, Cu, Fe, Ni, Ga, Co, Pt, In and Al; particularly consist of one element selected from Au, Ag, Cu, Fe, Co and Pt; preferably Au, Ag, Cu, Co and Fe; preferably Au, Co or Fe; preferably Fe.

In a particular embodiment, the metallic catalyst particles have an average diameter of between 0.1 and 100 nm; preferably of between 1 and 30 nm. The average diameters of the metallic catalyst particles of the present invention may be calculated from an average of the values obtained by measuring the diameters of more than 100 metallic catalyst particles using electronic microscopy micrographs or from the size distribution obtained from different aerosol measuring technics such as from a Differential Mobility Particle Sizer (DMA).

Furthermore, the metallic catalyst particles may be provided without electrical charge or the metallic catalytic particles may be given a charge.

The metallic catalyst particles may be provided to the reaction vessel in the form of an aerosol generated by an upstream aerosol generator such as a plasma, spark discharge and/or a thermal aerosol generator. Alternatively, the metallic catalyst particles may be formed in-situ by providing a precursor compound; preferably a gaseous or liquid precursor compound. In a preferred embodiment, the metallic catalyst particles are provided as a metallic catalyst particles precursor compound; preferably as an organometallic precursor compound; even more preferably as ferrocene.

In a particular embodiment, the metallic catalyst particles precursor compound comprises one or more element selected from Au, Ag, Cu, Fe, Ni, Ga, Co, Pt, In and Al; preferably one or more element selected from Au, Ag, Cu, Fe, Co and Pt; preferably Fe.

In a more particular embodiment, the metallic catalyst particles precursor compound is mixed with the at least one precursor compound of the present invention and injected into the reaction vessel.

In a more particular embodiment, the gas flow mixture of step (i) is generated by the following steps:

(a) providing a mixture comprising:
  - a metallic catalyst particle precursor comprising one or more elements selected from Au, Ag, Cu, Fe, Ni, Ga, Co, Pt, In and Al; and
  - an at least one precursor compound comprising at least one element selected from Si, Ge, Cu, Zn, Cd, Ga, In, As, Se, Ta, Pt, Mo, W, N, Ni, O, Co, Mn, Li and Te; and wherein the at least one precursor compound is an hydride or organometallic compound; and (b) injecting the mixture into the reaction vessel to form the gas flow mixture of step (i);

more preferably wherein the mixture is injected together with $H_2$ gas.

In a particular embodiment, the mixture of step (a) is a liquid and optionally the injection is produced by spraying said mixture into the reaction vessel. In a particular embodiment, when the mixture of step (a) enters the reaction vessel, the metallic catalyst particle precursor is decomposed into metallic catalyst particles.

In a particular embodiment, the metallic catalyst particles and/or the metallic catalyst particle precursor enter the reaction vessel at a rate of at least $1\times10^{-5}$ g/h; preferably of at least $1\times10^{-4}$ g/h; more preferably of at least $1\times10^{-3}$ g/h; even more preferably more preferably of between $1\times10^{-3}$ and $4\times10^{-3}$ g/h; even much more preferably of between $1.5\times10^{-3}$ and $3.5\times10^{-3}$ g/h; even much more preferably of between $2.0\times10^{-3}$ and $3.0\times10^{-3}$ g/h.

Means for mixture may be used. Pressure and flow rates might be adjusted if necessary to ensure a proper mixture of the gas flow mixture.

In a particular embodiment, the gas flow mixture flows in the reaction vessel at a rate of at least 60 l/h; preferably at least 120 l/h.

In another particular embodiment, the gas flow mixture has a residence time in the reaction vessel of less than 500 seconds; particularly of between 0.1 and 200 seconds; more particularly of between 1 and 100 seconds; even more particularly of between 2 and 90 seconds; preferably of between 4 and 80 seconds.

In addition to the gas flow mixture, one or more sheath flow may be introduced in the reaction vessel of the present invention. A sheath flow may include gases such as nitrogen, hydrogen, noble gases such as helium and argon or mixtures thereof.

In the method of the present invention the at least one precursor compound is in the gas flow mixture in a mole fraction (xi) of at least 0.005.

In a particular embodiment, the at least one precursor compound is in the gas flow mixture in a mole fraction of at least 0.006; particularly of at least 0.01; more particularly of at least 0.015; even more particularly of between 0.01 and 0.5; preferably of about 0.02. In the context of the present invention, the mole fraction is expressed as the amount of a constituent (in moles), divided by the total amount of all constituents (also expressed in moles).

In a particular embodiment, the at least one precursor compound of the present invention is in the gas flow mixture in a concentration of at least $0.1*10^{-4}$ mol/l; particularly in a concentration of at least $1*10^{-4}$ mol/l; more particularly in a concentration of at least $1.5*10^{-4}$ mol/l; even more particularly of at least $2*10^{-4}$ mol/l.

In a particular embodiment, the gas flow mixture comprises $H_2$.

In an embodiment, the gas flow mixture comprises:
- at least one precursor compound comprising at least one element selected from Si, Ge, Cu, Zn, Cd, Ga, In, As, Se, Ni, Ta, Pt, Mo, W, N, O, Co, Mn, Li and Te;
- wherein the at least one precursor compound is an hydride or organometallic compound; and
- metallic catalyst particles consisting of one or more element selected from Au, Ag, Cu, Fe, Ni, Ga, Co, Pt, In and Al; and
- at least a sheath gas selected from nitrogen, hydrogen and noble gases.

In an embodiment, the gas flow mixture comprises:
- at least one precursor compound comprising at least one element selected from Si, Ge, Pt, Mo, W, Co, Mn, Li and Te; wherein the at least one precursor compound is an hydride or organometallic compound; and
- metallic catalyst particles consisting of one or more element selected from Au, Ag, Cu, Fe, Ni, Pt, In and Al; and
- at least a sheath gas selected from nitrogen, hydrogen and noble gases.

In an embodiment, the gas flow mixture comprises:
- at least one precursor compound comprising at least one element selected from Si, Ge, Pt, W, Mn, Li and Te; wherein the at least one precursor compound is an hydride or organometallic compound; and
- metallic catalyst particles consisting of one or more element selected from Au, Ag, Cu, Fe, Pt, and In; and
- at least a sheath gas selected from nitrogen, hydrogen and noble gases.

In a preferred embodiment, the gas flow mixture comprises:
- at least one precursor compound comprising at least one element selected from Si or Ge; wherein the at least one precursor compound is an hydride or organometallic compound; and
- metallic catalyst particles consisting of Fe; and
- at least a sheath gas selected from nitrogen, hydrogen and noble gases.

In an embodiment, the gas flow mixture consists of:
- at least one precursor compound comprising at least one element selected from Si, Ge, Cu, Zn, Cd, Ga, In, As, Se, Ni, Ta, Pt, Mo, W, N, O, Co, Mn, Li and Te;
- wherein the at least one precursor compound is an hydride or organometallic compound; and
- metallic catalyst particles consisting of one or more element selected from Au, Ag, Cu, Fe, Ni, Ga, Co, Pt, In and Al; and
- at least a sheath gas selected from nitrogen, hydrogen and noble gases.

In an embodiment, the gas flow mixture consists of:
- at least one precursor compound comprising at least one element selected from Si, Ge, Pt, Mo, W, Co, Mn, Li and Te; wherein the at least one precursor compound is an hydride or organometallic compound; and
- metallic catalyst particles consisting of one or more element selected from Au, Ag, Cu, Fe, Ni, Pt, In and Al; and at least a sheath gas selected from nitrogen, hydrogen and noble gases.

In an embodiment, the gas flow mixture consist of:

at least one precursor compound comprising at least one element selected from Si, Ge, Pt, W, Mn, Li and Te; wherein the at least one precursor compound is an hydride or organometallic compound; and metallic catalyst particles consisting of one or more element selected from Au, Ag, Cu, Fe, Pt, and In; and at least a sheath gas selected from nitrogen, hydrogen and noble gases.

In a preferred embodiment, the gas flow mixture consist of:

at least one precursor compound comprising at least one element selected from Si or Ge; wherein the at least one precursor compound is an hydride or organometallic compound; and metallic catalyst particles consisting of Fe; and at least a sheath gas selected from nitrogen, hydrogen and noble gases.

Reaction Vessel

In a particular embodiment, the reaction vessel used in the process of the present invention is a gas reaction vessel; preferably a cylindrical reaction vessel; more preferably a ceramic or metallic cylindrical reaction vessel; even more preferably a ceramic cylindrical reaction vessel such as a tube.

In a particular embodiment, the temperature inside the reaction vessel is homogeneous; in particular is homogeneous within 50 degrees along the reactor tube, more particularly is homogeneous over 80 cm from the hot zone; particularly between 30-50 cm of the hot zone.

In a particular embodiment, the temperature inside the reaction vessel ranges from 1100 to 1600° C.; preferably the temperature ranges from 1150 to 1550° C.; more preferably from 1200 to 1500° C.; more preferably from 1250 to 1450° C.; more preferably from 1260 to 1400° C.; even more preferably is about 1260, 1270, 1280, 1290, 1300, 1310, 1320, 1330, 1340, 1350, 1360, 1370 or 1380° C.

The authors of the present invention have observed that a reaction temperature of at least 1100° C. and up to 1600° C. significantly increases the fraction of nanowires in the network of nanowires and their aspect ratio. In addition, it has been observed that the use of said temperature reduces significantly the amount of quasi-spherical particles. As derivable from the experimental data provided in the examples, the method of the invention provides nanowires with significantly higher average aspect ratios than those obtained by methods conducted at lower temperatures. Furthermore, it can also be observed that the presence of quasi-spherical particles is almost negligible, particularly for temperatures of at least 1300° C.

Moreover, it has been showed that the nanowire networks obtained at said temperatures have better mechanical properties and are more robust.

In a particular embodiment, the pressure inside the reaction vessel is between 500 mbar to 20000 mbar (50000 Pa to 2000000 Pa); preferably between 900 mbar to 3000 mbar (90000 Pa to 300000 Pa).

In a particular embodiment, the temperature inside the reaction vessel is reached by any suitable means of heating known in the art; preferably by plasma, arc discharge, resistive heating, hot wire heating, torch heating, or flame heating means; more preferably by resistive heating, hot wire heating, torch heating, or flame heating means.

Nanowire Network Growth

In the method of the present invention, the at least one precursor compound decomposes under the temperature conditions inside the reaction vessel and grows on the metallic catalyst particles by vapor liquid-solid (VLS) and/or solid-liquid-solid (SLS) and/or chemical vapor deposition (CVD) to form a network of nanowires. In a particular embodiment the nanowires grow while being in the gas flow mixture (i.e. they are aerosolized). In a particular embodiment, the at least one precursor compound decomposes under the temperature conditions inside the reaction vessel and grows on the metallic catalyst particles by floating catalyst chemical vapor deposition (CVD) to form a network of nanowires.

If necessary, one or more sheath flows may be introduced in the reaction vessel. In particular, said one or more sheath flows might be introduced between the gas flow mixture and the walls of the reaction vessel.

By choosing appropriate precursor compounds, gas flows, temperatures, pressures, and metallic catalyst particles, the nanowires can be grown in the axial or radial direction of their longitudinal symmetry axis, or in a combination of the two growth modes; preferably growth occurs in axial direction; more preferably growth occurs in the 110 direction; particularly for Si nanowires.

Nanowire growth may be initiated by catalytic decomposition of the at least one precursor compound on the surface of the metallic catalyst particles and nucleation of the nanowire on the surface of the metallic catalytic particles. After nucleation, the nanowire may grow directionally and form an elongated object, i.e. a nanowire. Growth may occur via vapor liquid-solid (VLS) and/or solid-liquid-solid (SLS) and/or chemical vapor deposition (CVD). At the same time, the nanowires reach a critical concentration and aggregate to form a network of nanowires in the reaction vessel. Thus, the method of the present invention is a continuous aggregated method. Preferably, the gas mixture flows through the reactor carrying metallic catalytic particles and the nanowire network flows through the reaction vessel length.

In an embodiment, the network of nanowires comprises hollow nanowires such as nanotubes. In an embodiment the network of nanowires comprises hollow and not hollow nanowires such as solid nanowires. In another embodiment, the network of nanowires consist of hollow nanowires such as nanotubes.

In the context of the present invention, the expression chemical vapor deposition (CVD) is understood as a process in which one or more volatile precursor compounds react and/or decompose on a catalyst surface to produce one-dimensional structures, such as nanowires. Said catalyst particle may be suspended in the gas phase, commonly referred to as floating catalyst. Said particles may be in molten or solid state and may include additional elements to control and/or enhance growth of nanowires as described herein above. This additional elements include group 16 elements, such as S, Se, Te, or oxygen. Said precursors may also partially decompose on the surface of the reactor.

In a particular embodiment, the method for preparing a network of nanowires of the present invention is performed under an aerogelation parameter of at least $1*10^{-7}$; particularly under an aerogelation parameter of at least $1*10^{-6}$; more particularly under an aerogelation parameter of at least $2*10^{-6}$.

In the context of the present invention, the expression "aerogelation parameter" is understood as the product of the average aspect ratio of the nanowires (length/diameter) and the volumetric concentration (vc (volume of nanowires/volume of the reactor)).

In the context of the present invention, the expression "vapor-liquid-solid" (VLS) is a mechanism for the growth of one-dimensional structures, such as nanowires, from chemical vapor deposition by direct adsorption of a gas (i.e. the at least one precursor compound on gas phase) on to a liquid catalyst particle, which can rapidly adsorb a vapor to supersaturation levels, and from which crystal growth can occur from nucleated seeds at the gas-liquid-solid interface.

In a particular embodiment, a nanowire network of the present invention is formed while being in the gas flow mixture (in the reaction vessel), particularly, a network of nanowires wherein the nanowires are aggregated (i.e. the nanowires are joined, entangled, connected or fused among them) is obtained at the exit of the reaction vessel of the present invention.

In a particular embodiment, the network of nanowires of the present invention is generated as a continuous process. Alternatively, the network of nanowires may be discretely generated. In a preferred embodiment, the network of nanowires of the present invention is continuously generated.

In a particular embodiment, the method of the present invention further comprises a step (ii) of collecting the network of nanowires. In an embodiment the step of collection is performed on a substrate; preferably wherein the substrate is a filter; more preferably a vacuum filter. In a more particular embodiment, the method of the present invention further comprises a step of densification of the network of nanowires; preferably by using a solvent or a mixture of solvents; more preferably an organic solvent or a mixture of organic solvents; even more preferably a solvent or a mixture of solvents comprising an alcohol group or an aromatic group; even much more preferably alcohols and/or benzene derivatives; even more preferably isopropanol and/or xylene.

In a particular embodiment, the network of nanowires of the present invention is generated at a rate of at least 0.01 g/h; preferably at a rate of at least 0.02 g/h; more preferably at a rate of at least 0.05 g/h; even more preferably at a rate of about 0.1 g/h.

In another particular embodiment, the network of nanowires of the present invention is generated at a rate of between 0.01 g/h and 10 g/h; preferably at a rate of between 0.02 g/h and 5 g/h; more preferably at a rate of between 0.05 g/h and 1 g/h; even more preferably at a rate of at between 0.09 g/h and 1 g/h.

Network of Nanowires

An aspect of the present invention is directed to a network of nanowires obtainable by the method of the present invention in any of its particular embodiments; wherein the average aspect ratio (length/diameter) of the nanowires of the network of nanowires is at least 300; and wherein the network of nanowires of the present invention comprise at least a 20% volume of nanowires of the total volume of the network. In a particular embodiment, the total volume of the network refers to the total volume of the constituents of the network such as nanowires, nanoparticles and amorphous material.

In a particular embodiment, the network of nanowires of the present invention comprises at least a 22% volume of nanowires of the total volume of the nanowire network; preferably at least 25%; more preferably at least 30%; even more preferably at least 40%.

In a particular embodiment, the nanowire volume percentage of the total volume of the nanowire network is between 20 and 99%; preferably between 22 and 98%.

More particularly, the network of nanowires of the present invention comprise at least a 50% volume of nanowires of the total volume of the network, preferably at least 60% volume, more preferably at least 70% volume, much more preferably at least 80% volume, and most preferably at least 90% volume of nanowires of the total volume of the network.

In a particular embodiment, the network of nanowires of the present invention comprises at least a 22 wt % of nanowires of the total weight of the nanowire network; preferably at least 25%; more preferably at least 30%; even more preferably at least 40%.

In a particular embodiment, the nanowire weight percentage of the total weight of the nanowire network is between 20 and 99%; preferably between 22 and 98%.

More particularly, the network of nanowires of the present invention comprise at least a 50 wt % of nanowires of the total weight of the network, preferably at least 60 wt %, more preferably at least 70 wt %, much more preferably at least 80 wt %, and most preferably at least 90 wt % of nanowires of the total volume of the network.

In another preferred embodiment, the nanowires of the network of nanowires of the present invention are crystalline nanowires.

The volume percentage of crystalline nanowires of the total volume of the network may be calculated from image analysis of electron micrographs using methods known in the art wherein the contribution of nanowires might be separated from other materials. For example, the volume fraction of crystalline nanowires of the total effective volume of the network may be calculated from the projected area occupied by the nanowires ($A_{NW}$) and the projected area occupied by other materials of the network ($A_{OM}$) such as amorphous particles from a significant number of electron micrographs. Then, the volume fraction may be converted into volume %. In addition, the weight % of crystalline nanowires of the total weight of the network may be calculated from the volume % values using the density of the materials as known in the art.

In the context of the present invention, a crystalline nanowire is understood as a nanowire with an organized crystal structure. In a particular embodiment, a crystalline nanowire comprises at least a 80 wt % of the total weight of the nanowire as a crystalline structure; preferably more than 90 wt %; more preferably more than 95 wt %; even more preferably more than 97 wt %; much more preferably more than 99, 99.5 or 99.9 wt %.

In a particular embodiment, a crystalline nanowire consist of

- between 80 wt % and 99.9 wt % of the total weight of the nanowire of crystalline material; and
- between 0.01 wt % and 20 wt % of the total weight of the nanowire of amorphous material; wherein the total weight of the nanowire is 100 wt %.

In a particular embodiment, a crystalline nanowire consist of

- between 90 wt % and 99.9 wt % of the total weight of the nanowire of crystalline material; and
- between 0.01 wt % and 10 wt % of the total weight of the nanowire of amorphous material; wherein the the total weight of the nanowire is 100 wt %.

In a particular embodiment, the nanowires of the network of nanowires of the present invention form a network; preferably the nanowires of the network of nanowires are mechanically joined, entangled, connected, or interlocked among them; preferably entangled, connected; more preferably entanglements are formed among them. In an embodiment, the network of nanowires comprises aggregates of nanowires.

In a particular embodiment, the network of nanowires is self-standing. In the context of the present invention the term "self-standing" refers to a structure that is not supported by other objects or structures, such as a substrate. In an embodiment, the network of nanowires does not comprise an additional phase such as an additional matrix or binder.

In a particular embodiment, the nanowires of the network of the present invention are aggregated; particularly are strongly aggregated; particularly they are strongly aggregated by secondary forces such as van der Waals forces, permanent dipoles, hydrogen bonds and/or covalent bonds, entanglements and other forms of mechanical interlock. By strongly aggregated, in the context of the present invention it is implied that the materials form a solid object and that the nanowires that comprise the network cannot be easily dispersed without recourse to sonication, stirring, cutting or similar methods.

In a particular embodiment, the network of nanowires of the present invention is a continuous network. In the context of the present invention, a continuous network is understood as a percolated network.

In a particular embodiment, the network of nanowires of the present invention is an aerogel, i.e. a solid material of low density; preferably of a density of below $10^{-2}$ g/cm$^3$; preferably of below $10^{-3}$ g/cm$^3$; more preferably of below $10^{-4}$ g/cm$^3$; more preferably of below $10^{-5}$ g/cm$^3$. In a particular embodiment, the network of nanowires of the present invention has a density of at least 0.001 g/cm$^3$; particularly of at least 0.01 g/cm$^3$.

In a more particular embodiment, the network of nanowires of the present invention is densified; particularly by mechanical methods, solvents addition methods, electromagnetic methods or similar methods.

In a particular embodiment, the nanowires of the network of the present invention have an average aspect ratio (length/diameter) of at least 300; even more preferably of at least 350; even more preferably of at least 400.

In a more particular embodiment, the nanowires of the network of the present invention have an average aspect ratio (length/diameter) of between 300 and 2000; preferably of between 350 and 2000; more preferably of between 400 and 1800, even more preferably from 500 to 1800 and much more preferably from 1000 to 1800.

The method to determine aspect ratio makes use of image analysis of electron micrographs obtained by electron microscopy. From these micrographs it is possible to determine the diameter (ϕ) and length (L) of nanowires and, therefore, the aspect ratio of a nanowire can be calculated from:

$$s = \frac{L}{\phi}$$

The average aspect ratio of the nanowires of the network of the present invention may be calculated from an average of the values obtained by measuring the dimensions of a significant number of nanowires (more than 100). Thus, the average aspect ratio can be determined by the following equation:

$$\bar{s}_{NW} = \frac{\sum s_i}{N_{NW}}$$

where $s_i$ is the aspect ratio of nanowires measured, and $N_{NW}$ is the number of nanowires analysed.

In a particular embodiment, the average length of the nanowires of the network of the present invention is at least 1 micron; particularly at least 2 microns; preferably at least 3, 4, 5, 6, 7, 8 or 9 microns; more preferably at least 10 microns. In a particular embodiment, the average length of the nanowires of the network of the present invention is between 1 and 40 microns, more particularly between 1 and 30 microns; preferably between 2 and 20 microns; more preferably between 3 and 15 microns. In another preferred embodiment, the average length of the nanowires of the network of the present invention is between 10 and 40 microns. The average length of the nanowires of the network of the present invention may be calculated from an average of the values obtained by measuring the lengths of more than 100 nanowires using electron microscopy.

In a particular embodiment, the network of nanowires of the present invention has a porosity below 99.9%; particularly below 99%; more particularly below 97%; even more particularly about 96%.

In another particular embodiment, the network of nanowires of the present invention has a porosity below 90.0%.

In an alternative embodiment, the network of nanowires of the present invention has a porosity of between 99.9% and 30%; particularly of between 50% and 98%; more particularly of between 60% and 97%; even more particularly of about 96%.

The porosity of the network of nanowires has been measured using methods known in the art, such as determining the volume of a regular sample by optical and/or electron microscopy observation and measuring its weight gravimetrically; porosity is then calculated through comparison with the theoretical density of a monolithic crystal of the same substance as the nanowire as known in the art.

In a particular embodiment, the nanowires of the network of nanowires of the present invention comprises at least one material selected from GaAs, InP, GaP, $Ga_xIn_{1-x}As_yP_{1-y}$, $Al_xGa_{1-x}As_yP_{1-y}$, GaSb, $Ga_xIn_{1-x}As_ySb_{1-y}$, GaN, InN, AlN, $Al_zGa_xIn_{1-x-z}N$, Si, SiC, Ge, $Si_xGe_{1-x}$, $SiO_x$, $TiO_x$, $ZnO_x$, CdS, $Ta_x$, $MoS_y$, $WS_y$, $MoTe_y$, $TaSe_y$, $NbSe_y$, $NiTe_y$, BN, $Bi_zTe_y$, BP, Cu, Pt, $CoO_x$, $MnO_x$, $CuO_x$, $Li_xMn_yO$, $Li_xNi_yMn_zO$ and $Ni_x$ where $0 \leq x \geq 1$, $0 \leq y \geq 1$ and $0 \leq z \geq 1$; preferably comprise Si, SiC, Ge or $Si_xGe_{1-x}$ and $SiO_x$ where $0 \leq x \geq 1$; even more preferably comprises Si, Ge or $Si_xGe_{1-x}$ and $SiO_x$ where $0 \leq x \geq 1$; more preferably comprise Si or Ge; even more preferably comprises Si. In a particular embodiment, the nanowires of the network of nanowires of the present invention further comprise a coating; preferably an inorganic or carbon coating.

In another particular embodiment, the nanowires of the network of nanowires of the present invention consist of at least one material selected from GaAs, InP, GaP, $Ga_xIn_{1-x}As_yP_{1-y}$, $Al_xGa_{1-x}As_yP_{1-y}$, GaSb, $Ga_xIn_{1-x}As_ySb_{1-y}$, GaN, InN, AlN, $Al_zGa_xIn_{1-x-z}N$, Si, SiC, Ge or $Si_xGe_{1-x}$, $SiO_x$, $TiO_x$, $ZnO_x$, CdS, $Ta_x$, $MoS_y$, $WS_y$, $MoTe_y$, $TaSe_y$, $NbSe_y$, $NiTe_y$, BN, $Bi_zTe_y$, BP, Cu, Pt, $CoO_x$, $MnO_x$, $CuO_x$, $Li_xMn_yO$, $Li_xNi_yMn_zO$ and $Ni_x$ where $0 \leq x \geq 1$, $0 \leq y \geq 1$ and $0 \leq z \geq 1$; preferably consist of Si, SiC, Ge or $Si_xGe_{1-x}$ and $SiO_x$ where $0 \leq x \geq 1$; more preferably consist of at least one material selected from Si, SiC and Ge; even more preferably consist of Si or SiC. In another particular embodiment, the nanowires of the network of nanowires of the present invention consist of at least one material selected from Si, SiC and Ge and a coating; preferably an inorganic or carbon coating.

In a particular embodiment, the network of nanowires of the present invention has a volumetric density of at least 0.01 $g/cm^3$; particularly of at least 0.05 $g/cm^3$; more particularly of at least 0.075 $g/cm^3$; even more particularly of at least 0.080 $g/cm^3$ preferably of at least 0.150 $g/cm^3$; more preferably of at least 0.200 $g/cm^3$; even more preferably about 0.128 $g/cm^3$.

In a particular embodiment, the network of nanowires of the present invention has a volumetric density of between 0.01 $g/cm^3$ and 0.20 $g/cm^3$; particularly between 0.07 $g/cm^3$ and 0.30 $g/cm^3$. The volumetric density of the network of nanowires of the invention may be calculated from any experimental technique known in the art, particularly it is determined from areal density and thickness of the sample of the network of nanowires.

In a particular embodiment, the nanowires of the network of nanowires of the present invention are entangled; preferably are physically entangled.

In a particular embodiment, the network of nanowires of the present invention is a network that comprises nanowires. In a particular embodiment, the nanowires forming the network can have the same or different properties. In a more particular embodiment, the nanowires comprised in the network have different composition and/or aspect ratios.

In a particular embodiment, the nanowires of the network of nanowires are hollow (i.e. they are nanotubes); preferably they are nanotubes. In a more particular embodiment, the hollow nanowires comprise Si, SiC, Ge or $Si_xGe_{1-x}$ and $SiO_x$ where $0 \leq x \geq 1$; more preferably consist of at least one material selected from Si, SiC, Ge or $Si_xGe_{1-x}$ and $SiO_x$ where $0 \leq x \geq 1$; preferably from Si or SiC; even more preferably consist of SiC.

In a particular embodiment, the network of nanowires of the present invention further comprise the metallic catalyst particles used in the method of the present invention.

In a particular embodiment, the nanowires of the network of nanowires of the present invention further comprise coatings; particularly inorganic or carbon coatings; more preferably carbon coatings.

In another particular embodiment, the nanowires of the network of nanowires of the present invention can be chemically functionalized by gas-phase, liquid-phase, annealing or irradiation processes. In a particular embodiment, the chemical functionalization of the nanowires is performed in the synthesis process or in an additional step.

In a particular embodiment, the nanowires of the network of nanowires of the present invention further comprise a labeling or marking element or compound; wherein said labeling element or compound allow their traceability. In a particular embodiment, the labeling or marking of the nanowires is performed during the synthesis process or after said synthesis, in an additional step.

In a particular embodiment, the nanowires of the network of nanowires of the present invention are predominantly aligned.

In a particular embodiment, the nanowires of the network of nanowires of the present invention are drawn, stretched or subjected to electromagnetic or electrochemical methods to align the nanowires.

In a particular embodiment, the network of nanowires of the present invention further comprise particles; preferably amorphous particles; more preferably amorphous spherical particles.

In a particular embodiment, the nanowires of the network of nanowires of the present invention are crystalline; preferably the nanowires are formed by a single crystal; more preferably the nanowires of the network of nanowires are single crystal continuous nanowire; more preferably of SiC; even more preferably of a cubic and/or hexagonal phase of SiC.

In an embodiment, the network of nanowires of the present invention comprise a crystalline phase and an amorphous phase; preferably, wherein the crystalline phase is in at least a 25 wt % or a 40 wt % of the total weight of the network; more preferably in at least a 50 wt %; even more preferably in at least a 60 wt %; even more preferably wherein the crystalline phase comprises crystalline nanowires and the amorphous phase comprises amorphous particles; preferably amorphous spherical particles.

In an embodiment, the network of nanowires of the present invention comprise at least a 25 wt % of crystalline nanowires of the total weight of the network; preferably at least a 30 wt %; more preferably at least a 40 wt %.

The crystallinity of the nanowires can be determined by X-ray diffraction analysis (XRD) and Raman spectroscopy.

In another particular embodiment, the network of nanowires of the present invention consist of nanowires.

In an embodiment, the network of nanowires of the present invention has fracture energy values of at least 0.05 J/g; preferably of between 0.1 and 0.5 J/g. Fracture energy values have been measured by mechanical tensile tests of network of nanowire samples using conventional mechanical testing equipment as known in the art.

In an embodiment, the network of nanowires of the present invention has specific tensile strengths over 0.5 MPa/SG; preferably over 0.8 MPa/SG more preferably over 1 MPa/SG. In particular, specific tensile strengths values are in MPa/SG units, wherein SG stands for specific gravity being numerically equivalent to the density of the network of nanowires in units of $g/cm^3$. Specific tensile strengths may be measured by any tensile test technique known in the art, for example may be measured by mechanical tensile measurements of samples of network of nanowires using a Textechno Favimat tensile tester at a strain rate of 10%/min and preferably at a gauge length of 5 mm.

Nonwoven Material

Another aspect of the present invention is directed to a nonwoven material comprising at least two layers of the network of nanowires of the present invention. In a particular embodiment, each of the two layers has a thickness of at least 0.1 micron; preferably 0.5 micron; more preferably of at least 1 micron.

In another particular embodiment, the nonwoven material of the present invention is a nonwoven fabric; preferably a unidirectional nonwoven fabric.

In another particular embodiment, the nanowires of the network of nanowires of the nonwoven material of the present invention are oriented in a single direction; preferably in a single parallel direction.

In another particular embodiment, the nonwoven material of the present invention is nonwoven fabric wherein the nanowires of the network of nanowires are oriented in a single direction; preferably in a single parallel direction.

In another particular embodiment, the nonwoven material of the present invention is a yarn.

In another particular embodiment, the nonwoven material of the present invention can be chemically functionalized by gas-phase, liquid-phase, annealing or irradiation processes that modify the surface chemistry of the nanowires.

In a particular embodiment, the nonwoven material of the present invention further comprise an additive such as a binder or a pigment.

Uses

Another aspect of the present invention is directed to the use of the network of nanowires of the present invention or the nonwoven material of the invention in electronic devices, preferably optoelectronic devices.

Another aspect of the present invention is directed to the use of the network of nanowires or the nonwoven material of the invention, in heat transfer materials; preferably as heat transfer materials.

Another aspect of the present invention is directed to the use of the network of nanowires or the nonwoven material of the invention, in radiation absorbing materials, preferably as radiation absorbing materials.

Another aspect of the present invention is directed to the use of the network of nanowires or the nonwoven material of the invention, in biocompatible materials, preferably as biocompatible materials.

Another aspect of the present invention is directed to the use of the network of nanowires or the nonwoven material of the invention in batteries; preferably in lithium batteries. In an embodiment, the present invention is directed to the use of the network of nanowires of the invention or the nonwoven material of the invention, in batteries, preferably in lithium batteries; particularly in an electrode, a separator and/or a current collector of a battery; preferably in an electrode.

Electrode:

Another aspect of the invention is directed to an electrode comprising:

(a) the network of nanowires of the present invention in any of its particular embodiments or the nonwoven material of the present invention in any of its particular embodiments; and (b) an electrical connection or a current collector, preferably comprising an electrically conductive wire or an electrically conductive current collector; particularly wherein the wire or the current collector and the network of nanowires are electrically connected.

In a particular embodiment, the network of nanowires of the present invention in any of its particular embodiments or the nonwoven material of the present invention in any of its particular embodiments is coated with at least an electrically conductive compound; preferably with at least a carbon-based electrically conductive compound; more preferably with electrically conductive carbon such as carbon black.

In an embodiment, the electrode consist of:

(a) the network of nanowires of the present invention in any of its particular embodiments or the nonwoven material of the present invention in any of its particular embodiments; optionally coated; more preferably coated with at least an electrically conductive compound; preferably with a carbon-based electrically conductive compound; more preferably with electrically conductive carbon such as carbon black; and (b) an electrical connection or a current collector, preferably an electrically conductive wire or an electrically conductive current collector; particularly wherein the wire or the current collector and the network of nanowires are electrically connected.

In a more particular embodiment, the electrode is a cathode.

The authors of the present invention have observed that the mechanical properties endowed by the nanowire network eliminate the use of reinforcing additives (e.g. polymeric binders) in the electrode and enable methods to process or integrate such electrode without the need for solvents or other forms of dispersion traditionally used.

In addition, the authors of the present invention have observed that the electrodes of the invention show an improved performance.

EXAMPLES

The invention is illustrated by means of the following example that in no case limits the scope of the invention.

Examples

Example 1. Synthesis and Characterization of SiC Nanowires Networks

SiC nanowires networks were synthetized in a vertical Floating catalyst chemical vapor deposition (FCCVD) reactor via vapor-liquid-solid method (VLS) mechanism, using Fe as the metal catalyst and hexamethyldisilane (HMDS) as SiC precursor at different temperatures (1200° C., 1250° C. and 1300° C.).

Firstly, ferrrocene was added to liquid HMDS until saturation (≈16 mg/ml) was achieved. The mixture of ferrocene and HMDS was introduced through an injector placed at the upper part of the vertical floating catalyst chemical vapor (FCCV) reactor at a rate of 0.5 ml/h. The injecting system consisted in a capillary tube with a surrounding $H_2$ flow of 60 ml/min.

The reactor tube (Mullite 660, 0=7 cm) was kept at the desired reaction temperature (1200° C., 1250° C. or 1300° C.) in an inert atmosphere, with a $H_2$ atmosphere sustained with a constant flow of 3 lpm $H_2$ (see FIG. 1).

When the mixture of ferrocene and HMDS entered the reaction zone, an aerosol was formed and iron particles were generated. Said iron particles aggregated to form an aerosol of catalyst nanoparticles. The iron catalyst nanoparticles took part in the decomposition of the precursor, and were responsible for the growth of 1D nanowires through supersaturation from the precursor vapour and subsequent extrusion of the 1D nanowire.

Figure 2:
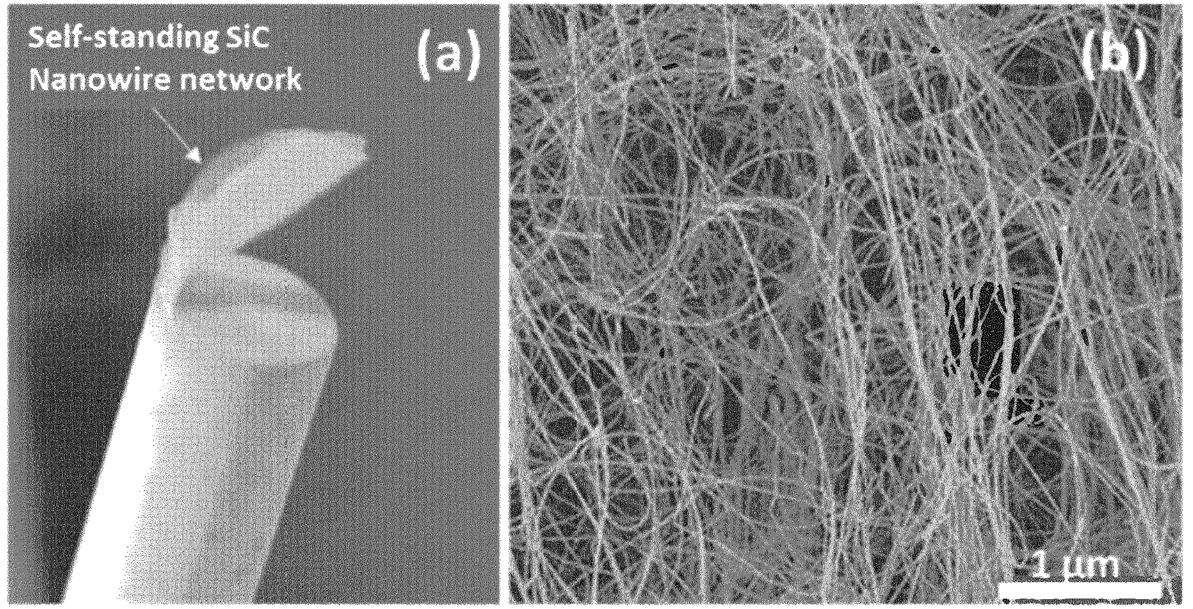
FIG. 2 shows an (a) image of a self-standing network of SiC nanowires and (b) an electron microscopy image of a nanowire network.
Figure 3:
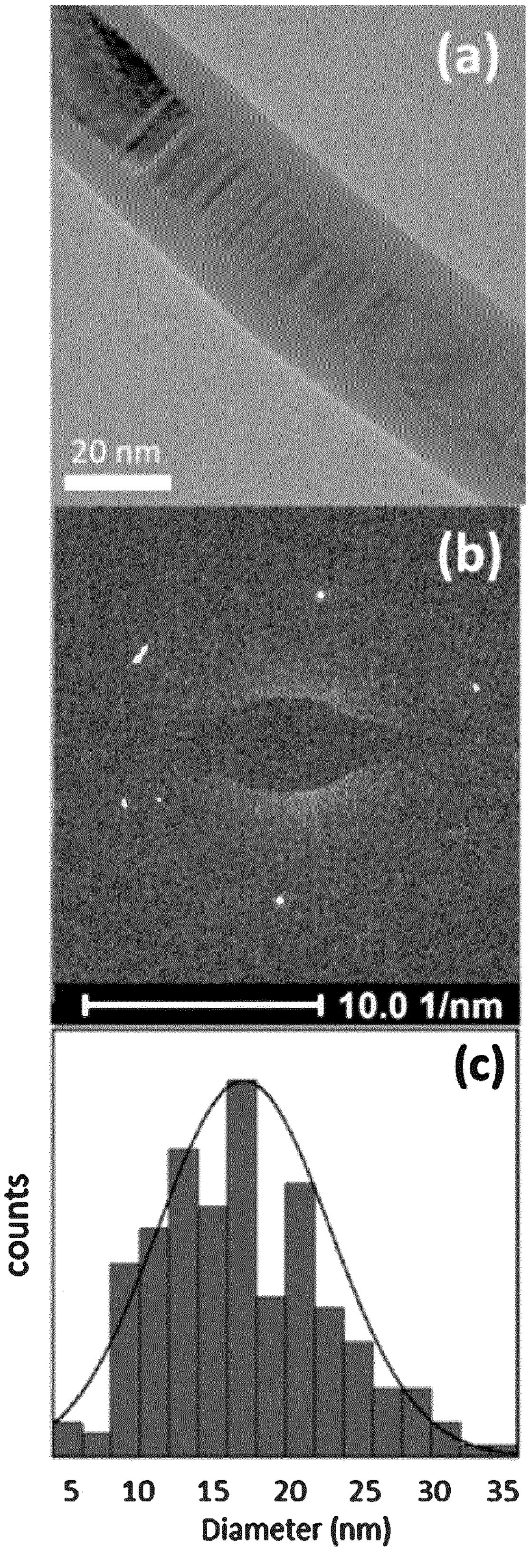
FIG. 3 shows (a) a transmission electron microscopy (TEM) micrograph of an individual SiC nanowire, (b) the electron diffraction pattern of crystalline SiC nanowires, (c) a statistical distribution of SiC nanowires diameters.
Figure 4:
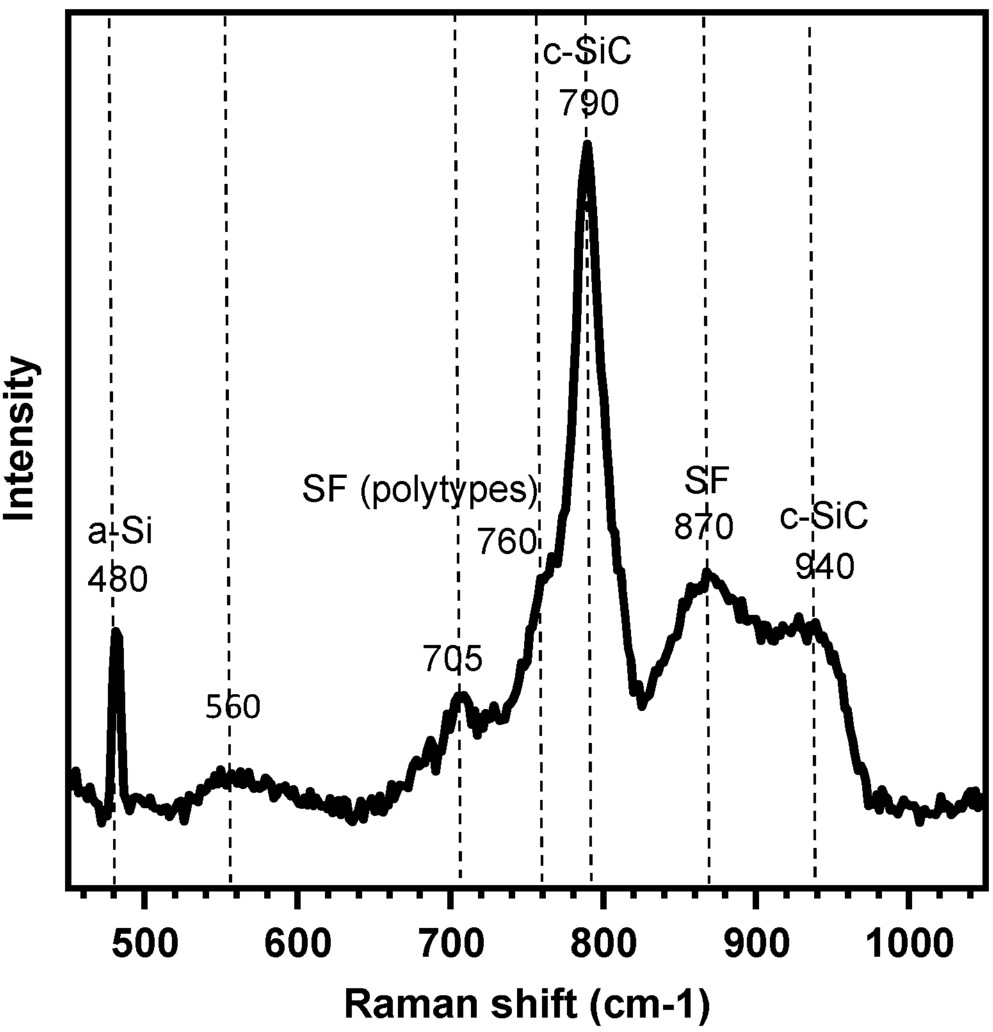
FIG. 4 shows a Raman spectroscopy spectra of a nanowire network.
Figure 5:
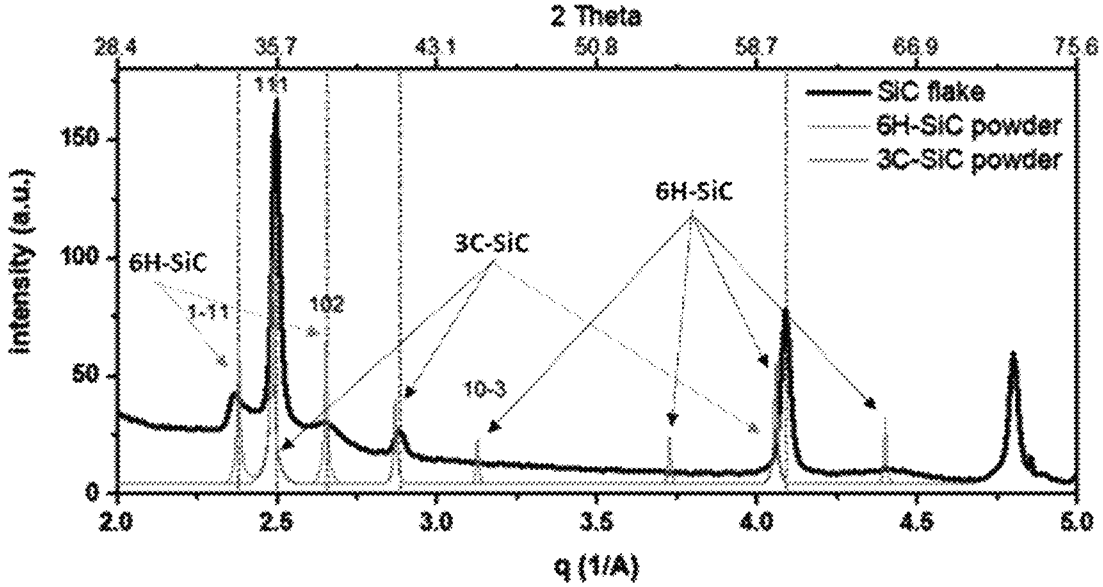
FIG. 5 shows an X-ray powder diffraction (XRD) patterns (right) of SiC nanowires.

Then, a bluish aerogel of nanowires was formed. Said aerogel was collected as a self-standing SiC nanowire network (see FIG. 2 and FIG. 3) inside of the reactor. The crystallinity of the resulting nanowires of the nanowire network was characterized by X-ray diffraction analysis (XRD) and Raman spectroscopy (FIGS. 4 and 5). In particular, the Raman spectrum of the nanowire network analyzed in FIG. 4 shows the Raman modes for SiC, indicating that the sample is predominantly made of SiC instead of other Si- or C-containing materials. Moreover, the XRD pattern of FIG. 5 shows that the nanowire network obtained is highly crystalline, formed predominantly of the cubic and/or hexagonal phase of SiC. In addition, the nanowires dimensions (length and diameters) and the network characteristics were statistically studied by a number of measurements (more than 50 measurements) from data collected from Scanning Electron Microscopy (SEM) and transmission electron microscopy (TEM).

Synthesizing the SiC nanowires networks at high temperatures (higher than 1100° C.) has two simultaneous benefits: increasing selective conversion ratio and increasing aspect ratio of the nanowires of the network. Selective conversion ratio refers to the transformation ratio of precursors into nanowires (instead of quasi spherical particles, amorphous particles and other materials different from nanowires).

Figure 6:
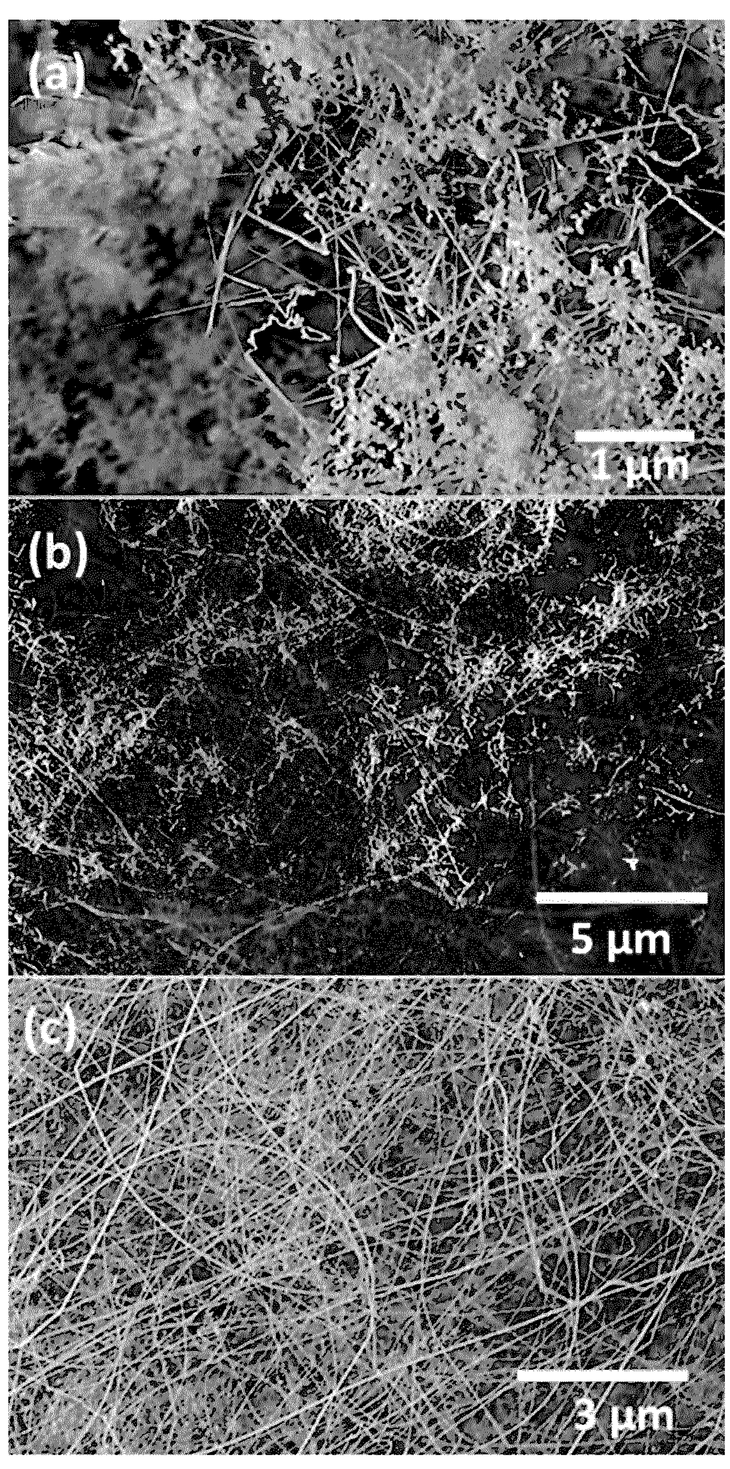
FIG. 6 shows SEM micrographs of SiC nanowire networks obtained at different temperatures: (a) 1200° C., (b) 1250° C. and (c) 1300° C.

FIG. 6 shows SEM micrographs of the SiC nanowires networks obtained at different temperatures (a) 1200° C., (b)

1250° C. and (c) 1300° C. From these images, the average aspect ratio of the nanowires was calculated from an average of the values obtained by measuring the dimensions of more than 50 nanowires by applying:

$$\bar{s}_{NW} = \frac{\sum s_i}{N_{NW}}$$

wherein $s_i$ are the aspect ratio of nanowires measured, and $N_{NW}$ is the number of nanowires analysed.

As explained herein above, the aspect ratio of each nanowire is measured according to the following equation:

$$s = \frac{L}{\phi}$$

wherein (ϕ) is the diameter and (L) the length of nanowires, respectively.

Furthermore, the average aspect ratio considering both, the nanowire and nanoparticle products of the reaction, was also determined. This provides an idea of the amount of undesired low aspect ratio quasi-spherical particles. This effective aspect ratio is labelled total number average aspect ratio, and it can be determined by:

$$\bar{s}_{total} = \frac{\sum s_i}{N_{NW} + N_{NP}}$$

where $s_i$ is the aspect ratio of nanowires, $N_{NW}$ is the number of nanowires and $N_{NP}$ is the number of nanoparticles.

In addition, the (a) crystalline nanowire volume percentage of the total volume of the nanowire network vs the synthesis temperature used was also measured.

The crystalline nanowire volume percentage of the total volume of the nanowire network constituents has been calculated from image analysis of a statistically significant number of electron micrographs (taken from microscopy techniques), where nanowires could be distinguished from quasi-spherical particles and other amorphous materials.

For comparative purposes, Si nanowires were also prepared at 650° C. and 720° C. following the method as described by Schäufele et al. (*Mater. Horiz.*, 2020, 7, 2978-2984). Table 1 below shows the length, average aspect ratio ($S_{NW}$) and the $S_{TOTAL}$ values determined as explained above of the nanowires obtained by the method of the invention and the method described by Schäufele et al., as well as the crystalline nanowire volume fraction.

| Reaction temperature (° C.) | Nanowires composition | Length (nm) | $S_{NW}$ | $S_{TOTAL}$ | Crystalline nanowire volume percentage (%) |
|---|---|---|---|---|---|
| 650 | Si | 4300 | 214 | n.d. | n.d. |
| 720 | Si | 4000 | 153 | 115 | 75 |
| 1250 | SiC | 29000 | 1607 | n.d. | 85 |
| 1300 | SiC | 33000 | 1800 | 1748 | 97.1 |

Results showed that a reaction temperature of at least 1100° C. significantly increased the fraction of nanowires in the sample and the lengths thereof, thus rendering nanowires with higher aspect ratios. Furthermore, the amount of undesired low aspect ratio quasi-spherical particles is significantly reduced as derivable form the total number average aspect ratios. In addition, the nanowires networks obtained at higher temperatures had better mechanical properties and were more robust.

Example 2

An electrode and a battery are developed comprising the nanowire network of the invention. The nanowire network of example 1 is coated with a conductive layer of carbon. Next, the nanowire network with carbon coating is affixed to a metallic current collector to form an electrode. Then, the electrode is integrated with a separator, a cathode and electrolyte inside a casing, to form a full battery cell.

The performance of the electrolyte is evaluated through conventional electrochemical measurements in a half-cell (i.e. using lithium as an electrode) under galvanostatic charge discharge cycles. Higher areal capacity ($mAh/cm^2$) is observed in the electrodes of the present invention in comparison with commercial graphite electrodes when measured at the same current density.

The invention claimed is:

1. A method for preparing a network of nanowires comprising the steps of:

i. providing a gas flow mixture to a reaction vessel, said gas flow mixture comprising:

at least one precursor compound comprising at least one element selected from Si, Ge, Cu, Zn, Cd, Ga, In, As, Se, Ni, Ta, Pt, Mo, W, N, O, Co, Mn, Li and Te; wherein the at least one precursor compound is an hydride or organometallic compound; and metallic catalyst particles comprising one or more elements selected from Au, Ag, Cu, Fe, Ni, Ga, Co, Pt, In and Al;

wherein the at least one precursor compound is in the gas flow mixture in a mole fraction (xi) of at least 0.005;

wherein the temperature inside the reaction vessel is in a range of between 1250 to 1450° C.; and wherein the at least one precursor compound decomposes under the temperature inside the reaction vessel and grows on the metallic catalyst particles, to form a network of nanowires;

wherein the network of nanowires comprises solid nanowires, hollow nanowires or mixtures thereof.

2. The method according to claim 1, wherein the at least one precursor compound decomposes under the temperature inside the reaction vessel and grows on the metallic catalyst particles by vapor liquid-solid (VLS) and/or solid-liquid-solid (SLS) and/or chemical vapor deposition (CVD).

3. The method according to claim 1, wherein the gas flow mixture of step (i) is generated by the following steps:

(a) providing a mixture comprising:

the at least one precursor compound comprising at least one element selected from Si, Ge, Cu, Zn, Cd, Ga, In, As, Se, Ni, Ta, Pt, Mo, W, N, O, Co, Mn, Li and Te; wherein the at least one precursor compound is an hydride or organometallic compound; and a metallic catalyst particle precursor comprising one or more elements selected from Au, Ag, Cu, Fe, Ni, Ga, Co, Pt, In and Al; and (b) injecting the mixture into the reaction vessel to form the gas flow mixture of step (i).

4. The method according to claim 1, wherein the at least one precursor compound comprises at least one element selected from Si, Ge, Pt, Mo, W, Co, Mn, Li and Te; and wherein the metallic catalyst particles consist of one or more elements selected from Au, Ag, Cu, Fe, Co and Pt.

5. The method according to claim 1, wherein the at least one precursor compound is a silane or silane derivative.

6. The method according to claim 1, wherein the gas flow mixture comprises $H_2$.

7. The method according to claim 1, wherein the temperature inside the reaction vessel is in a range of between 1260 to 1400° C.

8. The method according to claim 1, wherein the method comprises a further step (ii) of collecting the network of nanowires.

9. The method according to claim 8, wherein the further step (ii) of collecting the network of nanowires is done by spinning and winding the network of nanowires on a bobbin.

10. A network of nanowires obtainable by the method according to claim 1, wherein the aspect ratio of the nanowires of the network of nanowires is at least 300; wherein the network of nanowires of the present invention comprises at least an 80% volume of nanowires of the total volume of the network; wherein the nanowires are entangled and wherein the network of nanowires is self-standing.

11. The network of nanowires according to claim 10, wherein the aspect ratio of the nanowires is at least 400; wherein the length of the nanowires is at least 10 microns; wherein the nanowires of the network of nanowires are solid continuous crystalline nanowires; and wherein the network of nanowires of the present invention comprises at least an 80% volume of crystalline nanowires of the total volume of the network.

12. The network of nanowires according to claim 10, wherein the network of nanowires has a porosity of between 60 and 97%.

13. The network of nanowires according to claim 10, wherein the nanowires consist of Si, SiC, Ge or SixGe1-x and SiOx, wherein 0≤x≤1.

14. A nonwoven material comprising at least two layers of the network of nanowires as defined in claim 10.

15. An electrode comprising the network of nanowires according to claim 10 or the nonwoven material according to claim 14; and an electrical connection or a current collector.

16. The network of nanowires according to claim 10, wherein the nanowires comprise at least one material selected from the list consisting of Si, SiC, Ge, $Si_xGe_{1-x}$, and $SiO_x$, wherein $0 \leq x \geq 1$.

* * * * *